United States Patent
Tsunoda

(10) Patent No.: US 9,941,869 B2
(45) Date of Patent: Apr. 10, 2018

(54) EMPHASIS SIGNAL GENERATION CIRCUIT AND EMPHASIS SIGNAL GENERATION METHOD

(71) Applicant: FUJITSU LIMITED, Kawasaki-shi, Kanagawa (JP)

(72) Inventor: Yukito Tsunoda, Isehara (JP)

(73) Assignee: FUJITSU LIMITED, Kawasaki (JP)

(*) Notice: Subject to any disclaimer, the term of this patent is extended or adjusted under 35 U.S.C. 154(b) by 110 days.

(21) Appl. No.: 14/315,393

(22) Filed: Jun. 26, 2014

(65) Prior Publication Data

US 2015/0022253 A1  Jan. 22, 2015

(30) Foreign Application Priority Data

Jul. 19, 2013 (JP) .................. 2013-151121

(51) Int. Cl.
*H03K 5/13* (2014.01)
*H03K 5/133* (2014.01)
*H03K 5/00* (2006.01)

(52) U.S. Cl.
CPC ... *H03K 5/133* (2013.01); *H03K 2005/00176* (2013.01)

(58) Field of Classification Search
CPC ...... H04B 10/677; H03K 5/133; H03K 5/131; H03K 5/14; H03K 2005/00176; H03K 2005/0019; H03K 2005/00052
USPC ...................................................... 327/231
See application file for complete search history.

(56) References Cited

U.S. PATENT DOCUMENTS

| | | | |
|---|---|---|---|
| 4,457,012 A * | 6/1984 | Carver ................. | H04B 1/1661 381/10 |
| 6,292,058 B1 | 9/2001 | Ide et al. | |
| 2004/0113656 A1 | 6/2004 | Sato | |
| 2004/0196755 A1* | 10/2004 | Cheng .................. | G11B 7/0906 369/44.25 |
| 2008/0054966 A1 | 3/2008 | Tamura | |
| 2009/0072916 A1* | 3/2009 | Bilionis ............... | H03B 5/1847 331/99 |
| 2012/0045223 A1* | 2/2012 | Oku ..................... | H04B 10/504 398/201 |
| 2012/0114067 A1* | 5/2012 | Tsunoda ................. | H04L 25/08 375/295 |
| 2012/0207204 A1 | 8/2012 | Hidaka | |
| 2013/0077149 A1 | 3/2013 | Tsunoda | |

FOREIGN PATENT DOCUMENTS

| JP | 2000-228623 | 8/2000 |
|---|---|---|
| JP | 2001-53631 | 2/2001 |
| JP | 2004-88693 | 3/2004 |

(Continued)

OTHER PUBLICATIONS

Japanese Office Action dated Mar. 28, 2017 in corresponding Japanese Patent Application No. 2013-151121.

*Primary Examiner* — Patrick Chen
(74) *Attorney, Agent, or Firm* — Staas & Halsey LLP

(57) ABSTRACT

A phase compensation circuit includes: a first circuit that increases phase characteristic of a specific frequency of an electrical signal; a second circuit that decreases the phase characteristic of the specific frequency of the electrical signal; and a limiting amplifier that amplifies an electrical signal that is processed by at least one of the first circuit and the second circuit.

6 Claims, 14 Drawing Sheets

(56) References Cited

FOREIGN PATENT DOCUMENTS

| JP | 2008-66836 | 3/2008 |
|----|------------|--------|
| JP | 2012-170081 | 9/2012 |
| JP | 2013-74438 | 4/2013 |

* cited by examiner

Params [eye6]

Params [eye6]

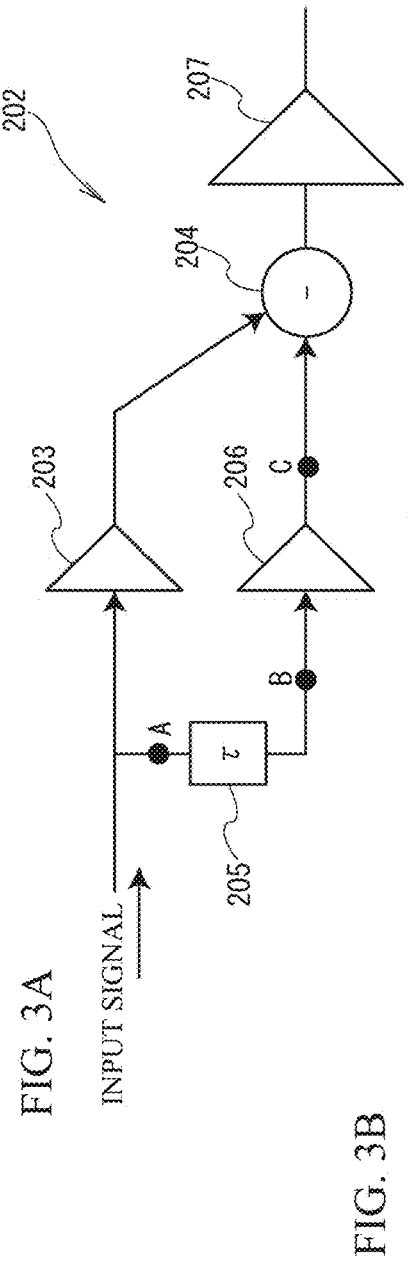
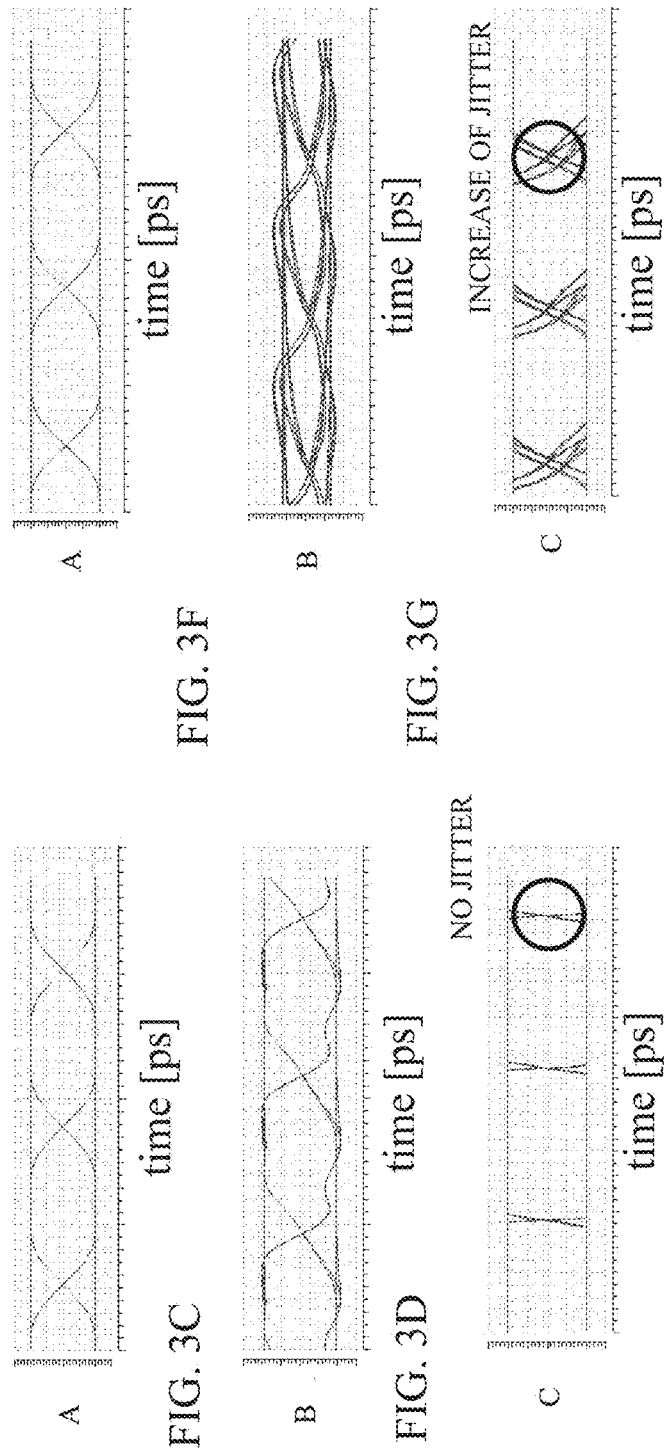
FIG. 3A
FIG. 3B
FIG. 3C
FIG. 3D
FIG. 3E
FIG. 3F
FIG. 3G

FIG. 6A
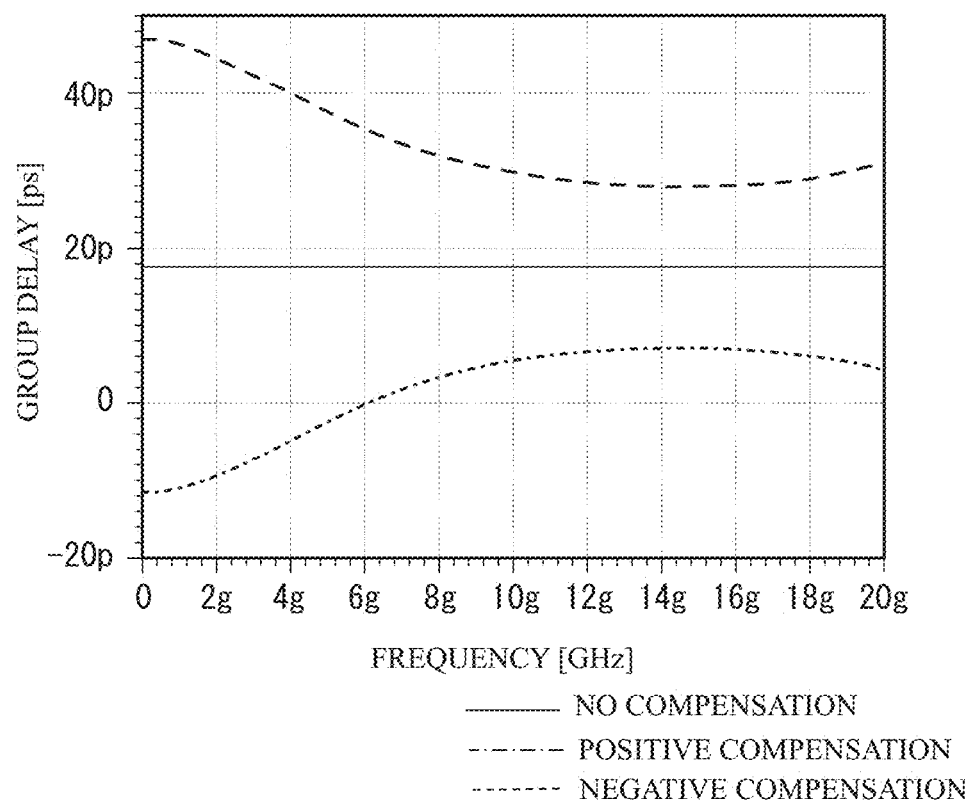
— NO COMPENSATION
--- POSITIVE COMPENSATION
------ NEGATIVE COMPENSATION
FIG. 6B  INPUT WAVEFORM
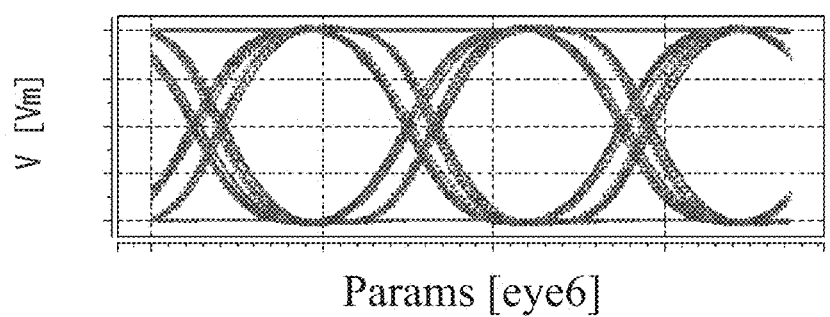
Params [eye6]
FIG. 6C  OUTPUT WAVEFORM    DECREASE OF JITTER
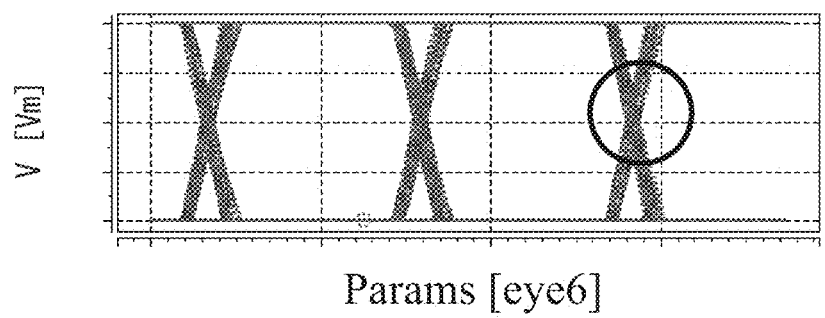
Params [eye6]

FIG. 7A PHASE OF HIGH FREQUENCY REGION: DECREASE DIRECTION
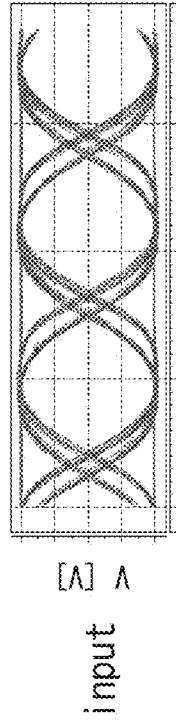
input [V]
Params [eye6]
FIG. 7B
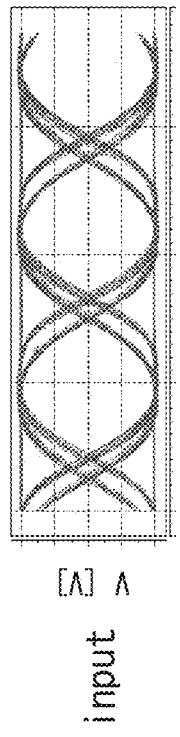
Output Emp. SMALL [V]
Params [eye6]
FIG. 7C
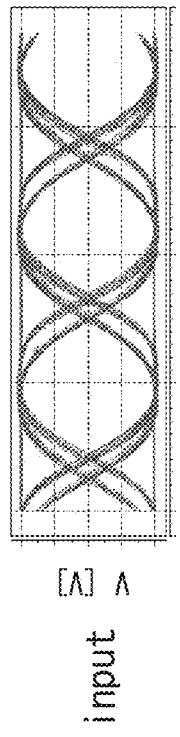
Output Emp. LARGE [V]
Params [eye6]
FIG. 7D PHASE OF HIGH FREQUENCY REGION: INCREASE DIRECTION
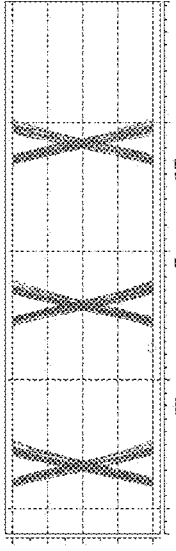
input [V]
Params [eye6]
FIG. 7E
← OPTIMAL POINT
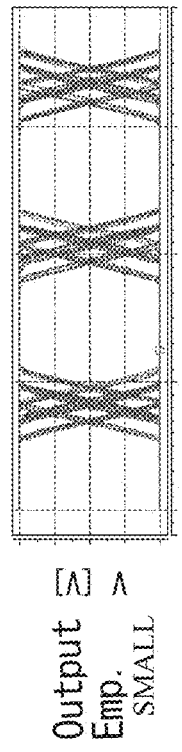
Output Emp. SMALL [V]
Params [eye6]
FIG. 7F
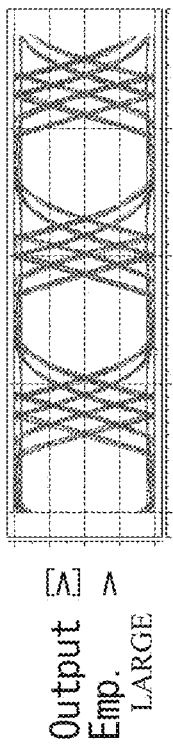
Output Emp. LARGE [V]
Params [eye6]

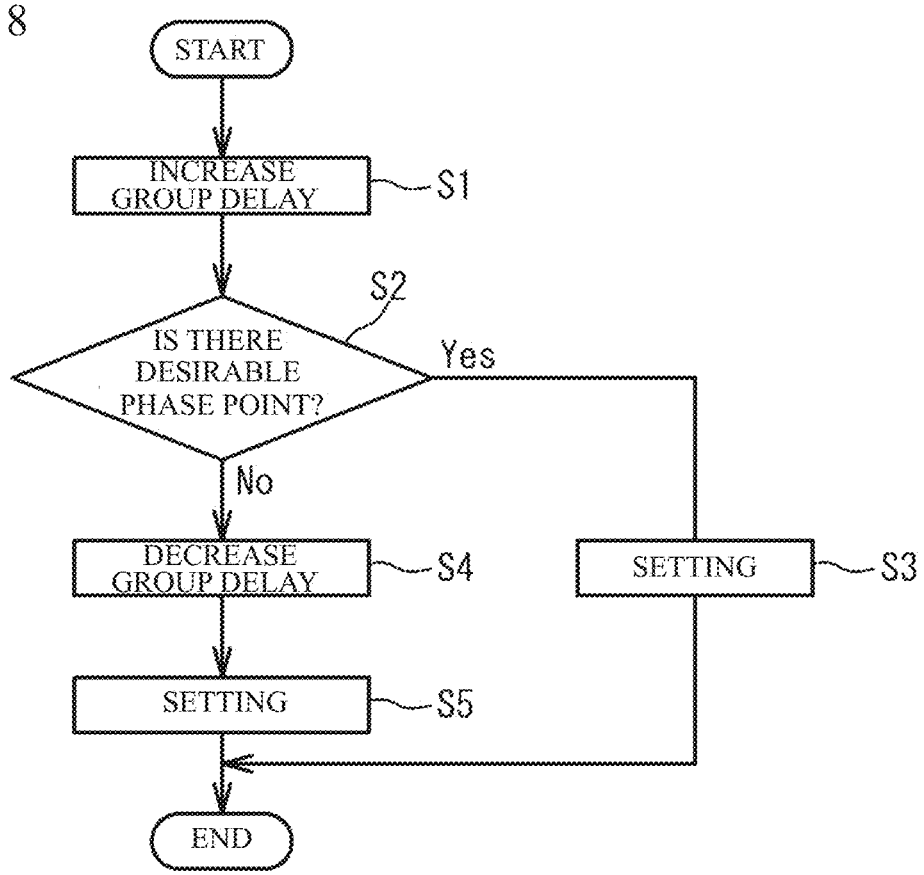

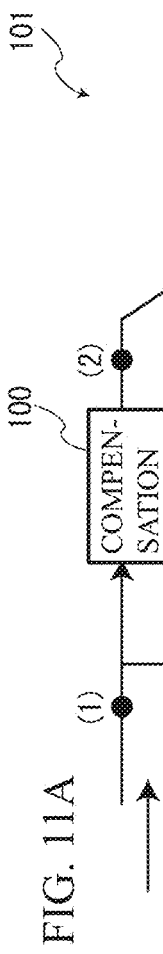
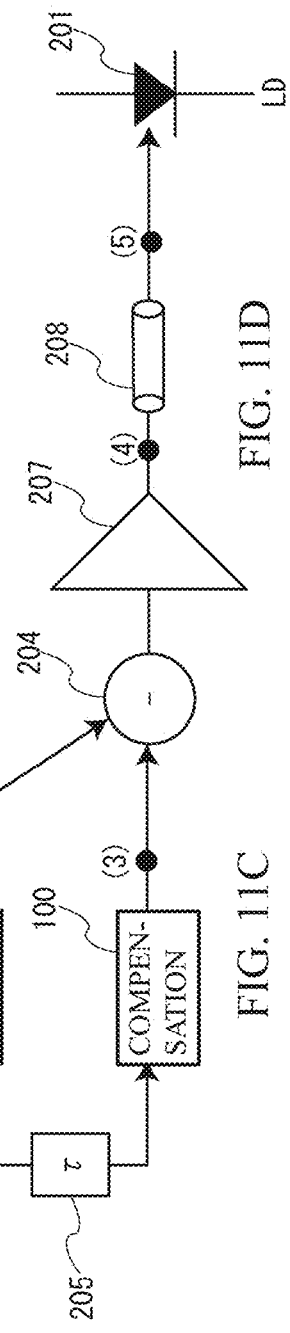
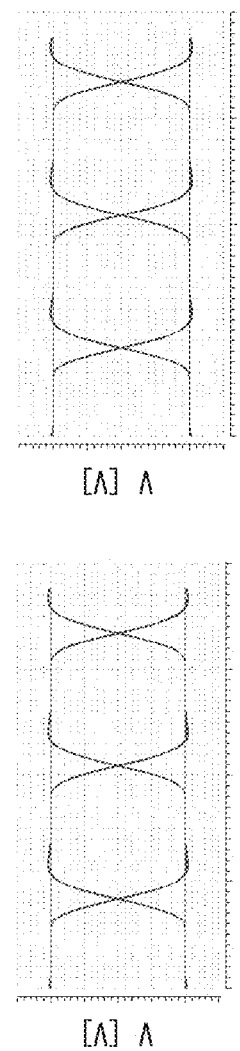
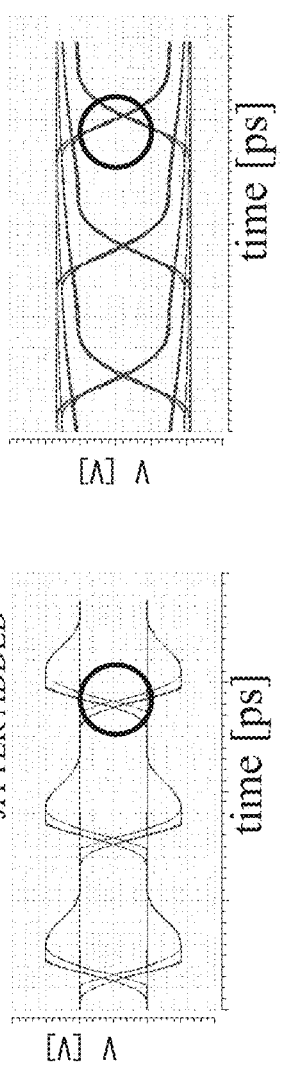
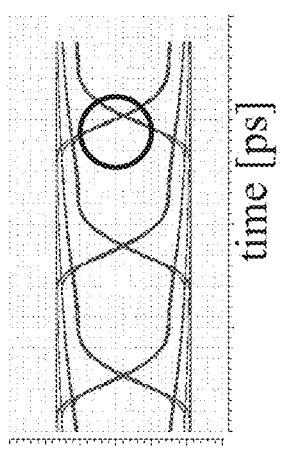
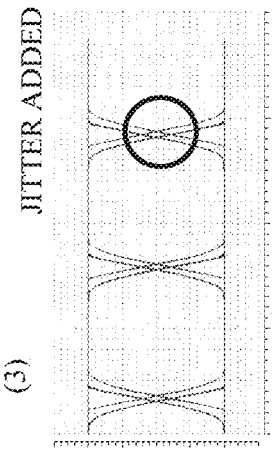
FIG. 11A
FIG. 11B
FIG. 11C
FIG. 11D
FIG. 11E
FIG. 11F

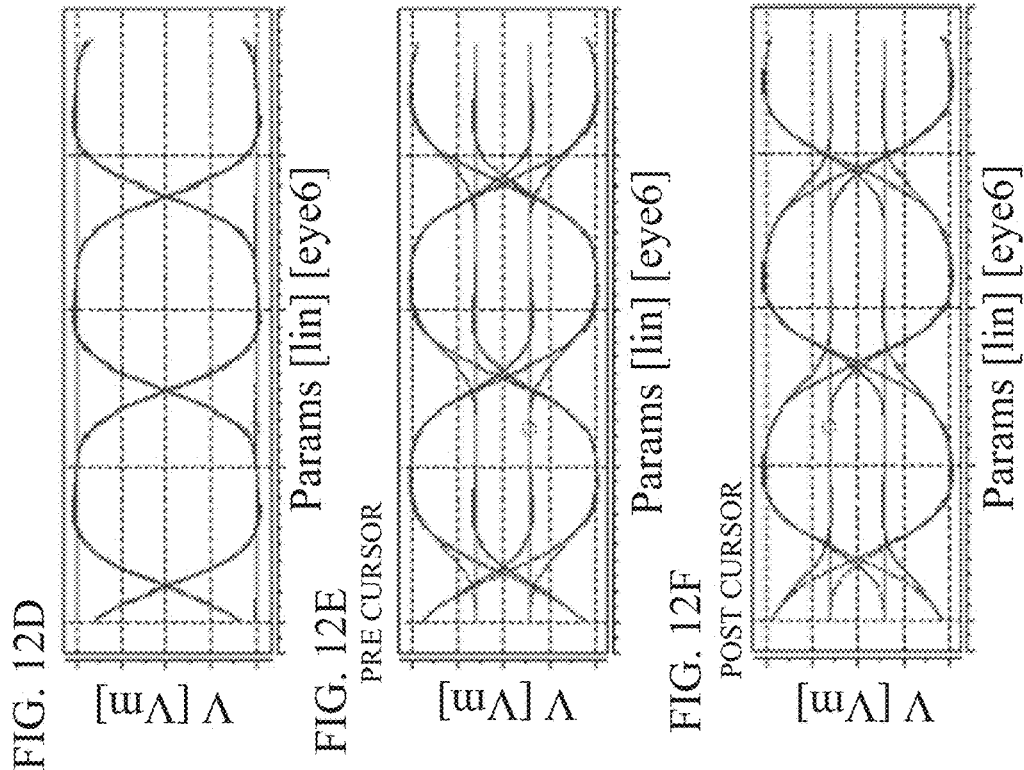
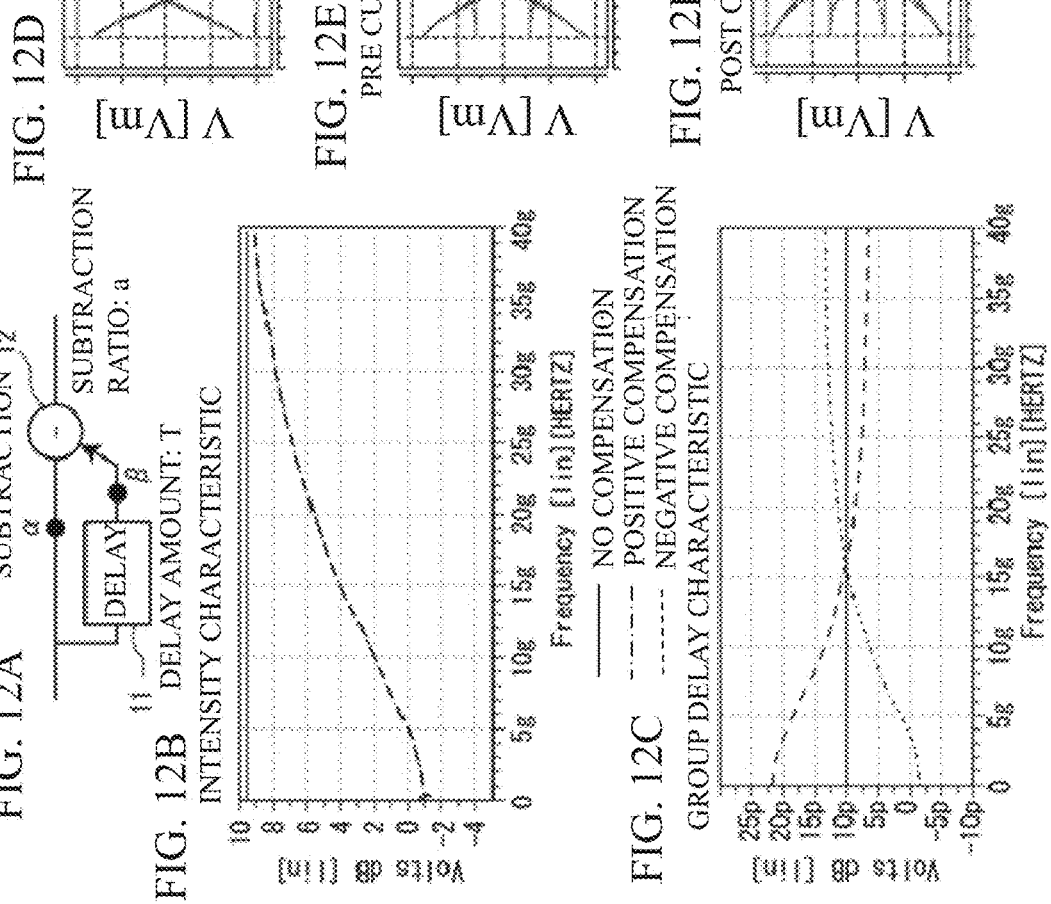
FIG. 12A
FIG. 12B INTENSITY CHARACTERISTIC
FIG. 12C GROUP DELAY CHARACTERISTIC
FIG. 12D
FIG. 12E PRE CURSOR
FIG. 12F POST CURSOR

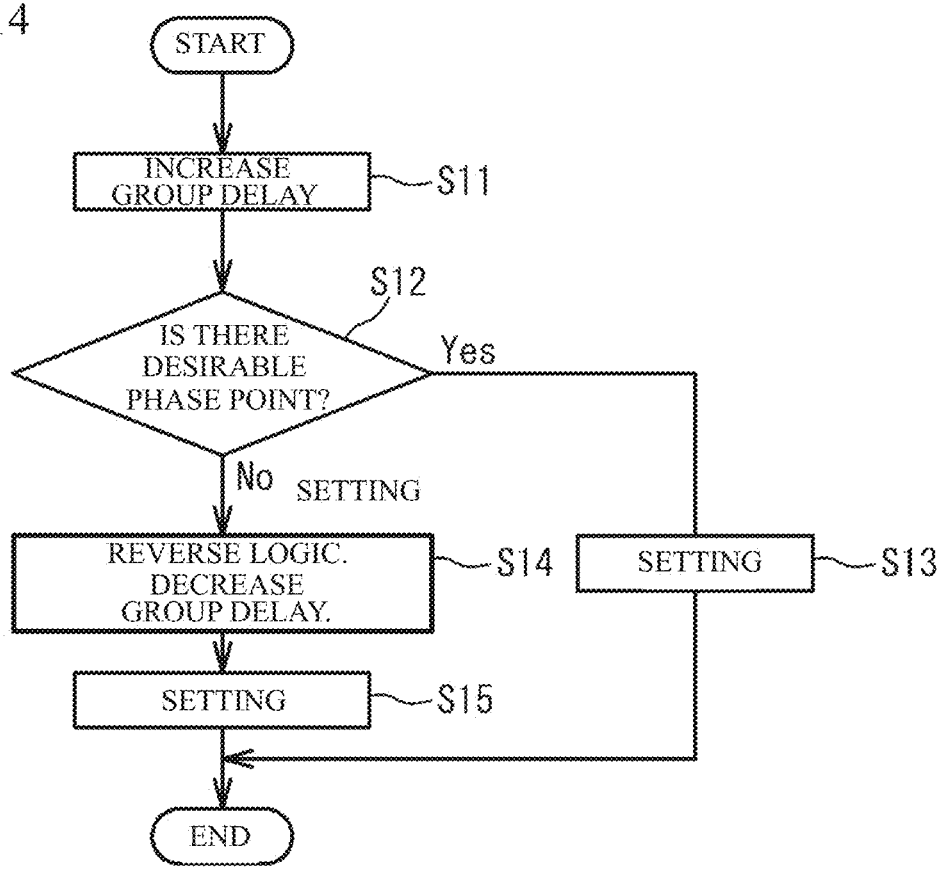

EMPHASIS SIGNAL GENERATION CIRCUIT AND EMPHASIS SIGNAL GENERATION METHOD

CROSS-REFERENCE TO RELATED APPLICATION

This application is based upon and claims the benefit of priority of the prior Japanese Patent Application No. 2013-151121, filed on Jul. 19, 2013, the entire contents of which are incorporated herein by reference.

FIELD

A certain aspect of embodiments described herein relates to a phase compensation circuit and a phase compensation method.

BACKGROUND

Japanese Patent Application Publications No. 2013-74438, No. 2012-170081, No. 2008-66836 and No. 2000-228623 disclose a circuit that processes an electrical signal in an optical transmitter-receiver.

SUMMARY

According to an aspect of the present invention, there is provided a phase compensation circuit including: a first circuit that increases phase characteristic of a specific frequency of an electrical signal; a second circuit that decreases the phase characteristic of the specific frequency of the electrical signal; and a limiting amplifier that amplifies an electrical signal that is processed by at least one of the first circuit and the second circuit.

According to another aspect of the present invention, there is provided a phase compensation circuit including: a phase adjust circuit that increases or decreases phase characteristic of a specific frequency by outputting a difference between an input electrical signal and a delay signal that is generated by delaying the input electrical signal; a control circuit that switches increasing and decreasing of the phase characteristic of the phase adjust circuit; and a limiting amplifier that amplifies an electrical signal that is processed by the phase adjust circuit.

According to another aspect of the present invention, there is provided a phase compensation method by using a phase compensation circuit including: achieving a desirable phase by adjusting phase characteristic of at least one of a first circuit and a second circuit, wherein the phase compensation circuit comprises: the first circuit that increases phase characteristic of a specific frequency of an electrical signal; the second circuit that decreases the phase characteristic of the specific frequency of the electrical signal; and a limiting amplifier that amplifies an electrical signal that is processed by at least one of the first circuit and the second circuit.

According to another aspect of the present invention, there is provided a phase compensation method by using a phase compensation circuit including: achieving a desirable phase by adjusting phase characteristic of at least one of a forward logic and a reverse logic of a difference between an input electrical signal and a delay signal that is generated by delaying the input electrical signal, wherein the phase compensation circuit comprises: a phase adjust circuit that increases or decreases phase characteristic of a specific frequency by outputting the difference; and a limiting amplifier that amplifies an electrical signal that is processed by the phase adjust circuit.

BRIEF DESCRIPTION OF DRAWINGS

FIG. 3A illustrates a pre-emphasis drive circuit;

FIG. 3B to FIG. 3G illustrate a waveform;

FIG. 6A illustrates characteristic of a phase compensation frequency;

FIG. 6B and FIG. 6C illustrate a waveform;

FIG. 7A to FIG. 7F illustrate a waveform;

FIG. 8 illustrates an example of a flowchart of a phase compensation method with use of a phase compensation circuit;

FIG. 11A illustrates a usage example of an emphasis signal generation circuit;

FIG. 11B to FIG. 11F illustrate a waveform;

FIG. 12A illustrates a part of a phase generation circuit;

FIG. 12B illustrates intensity characteristic;

FIG. 12C illustrates group delay characteristic;

FIG. 12D to FIG. 12F illustrate a waveform;

FIG. 14 illustrates a flowchart of a phase compensation method with use of a phase compensation circuit.

DESCRIPTION OF EMBODIMENTS

A waveform of an electrical signal of an optical transmitter-receiver may be degraded because of speeding-up of a data rate. A limiting amplifier can improve degradation in an intensity direction. However, a gap in a phase direction (jitter) tends to be accumulated. The jitter can be corrected with use of a clock. However, in order to generate the clock, a large-scale circuit is needed.

Figure 1:
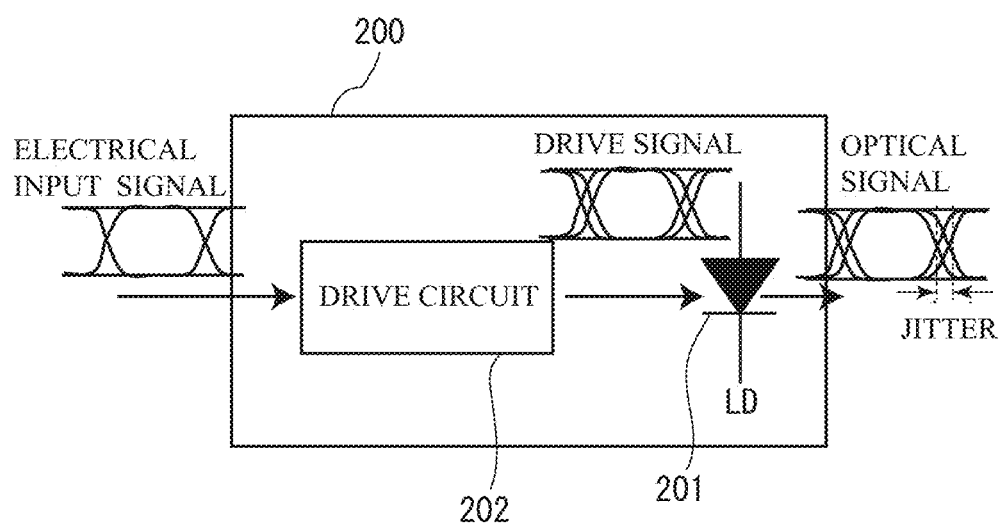
FIG. 1 illustrates a structure of an optical transmitter.

A description will be given of a gap in a phase direction of an electrical signal (jitter) before describing embodiments. FIG. 1 illustrates a structure of an optical transmitter 200. As illustrated in FIG. 1, the optical transmitter 200 has a light-emitting element 201 such as a semiconductor laser, a drive circuit 202 that drives the light-emitting element 201, and so on. An electrical signal is input into the drive circuit 202. The drive circuit 202 generates a drive signal for driving the light-emitting element 201 in accordance with the electrical signal. The light-emitting element 201 outputs an optical signal in accordance with the input drive signal. In a process of converting the electrical signal into an optical signal, a waveform may be degraded because of increasing of a jitter in the light-emitting element 201, the drive circuit 202, a mounted signal line (a PCB, a bonding wire or the like) and so on. A description will be given of a factor of the increasing of the jitter caused by the drive circuit.

Figure 2A:
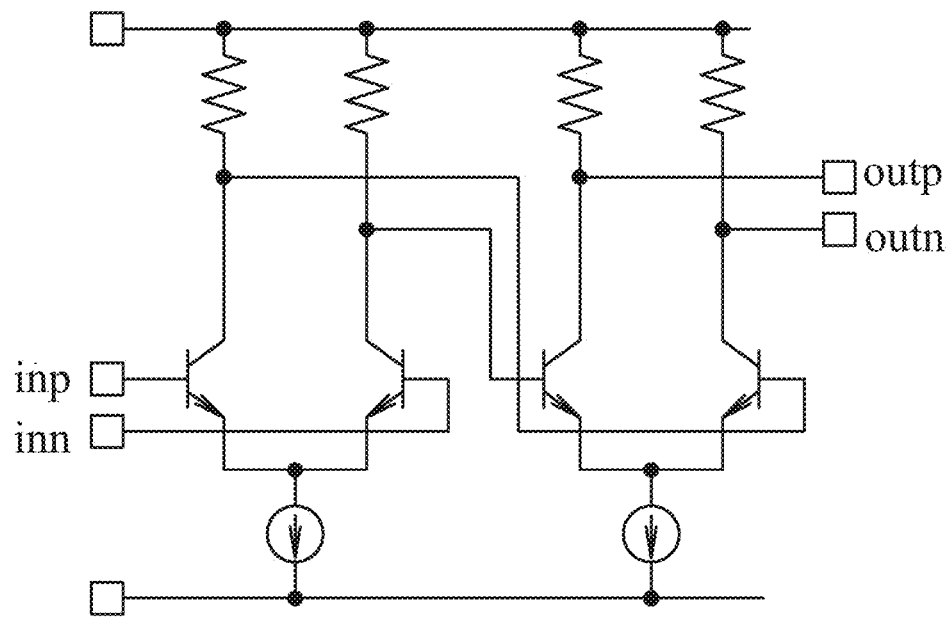
FIG. 2A illustrates a differential amplifier circuit as an example of an amplifier circuit.

An amplifier circuit is used when an electrical signal is used for a device driving or an electrical signal is transmitted in a signal line. FIG. 2A illustrates a differential amplifier circuit as an example of an amplifier circuit. In FIG. 2A, "inp" is a positive component of a main signal. "inn" is a negative component of the main signal. "outp" is a positive output signal. "outn" is a negative output signal. The differential amplifier circuit has two pair of differential transistors and two tail current sources. The differential amplifier circuit couples a collector of a transistor into which a positive signal of the main signal is input with a collector of a transistor into which a negative signal of a delayed signal is input, and couples a collector of a transistor into which a negative signal of the main signal is input with a collector of a transistor into which a positive signal of the delayed signal is input. It is possible to adjust a subtraction ratio by adjusting a current ratio of the tail current sources of the two differential pairs.

Figure 2B:
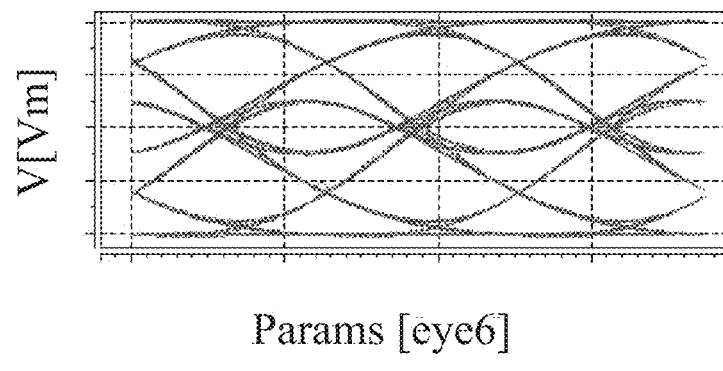
FIG. 2B illustrates a signal waveform degraded because of a band shortage.
Figure 2C:
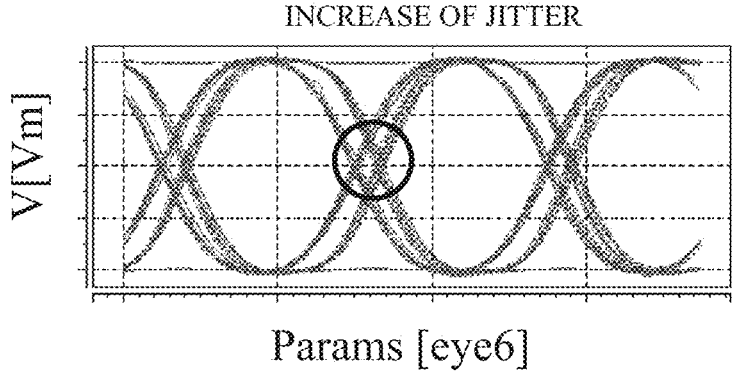
FIG. 2C illustrates a signal waveform in a case where intensity direction is improved and a jitter is accumulated.

An eye opening may be degraded because of a band shortage of a signal line, a drive device, a circuit or the like. FIG. 2B illustrates a signal waveform degraded because of the band shortage. When a gain is increased in an amplifier circuit of which band is deficient or a plurality of amplifier circuits of which band is deficient are connected, a rising or a falling is improved because of a limiting. However, in this case, a jitter is accumulated. FIG. 2C illustrates a signal waveform in a case where intensity direction is improved but the jitter is accumulated.

FIG. 3A illustrates the pre-emphasis drive circuit 202. "205" of FIG. 3A indicates a delay circuit for a pre-emphasis generation used for a speed compensation or the like. The pre-emphasis generation means previously enforcing a part in which intersymbol interference of a signal tends to occur, in view of degradation of a waveform. As illustrated in FIG. 3A, an input signal is branched. A main path acting as one branched interconnection line is coupled to a subtraction unit 204 via a limiting amplifier 203. A delay path acting as the other branched interconnection line is coupled to the subtraction unit 204 via the delay unit 205 and a limiting amplifier 206. An output signal of the subtraction unit 204 is amplified by a drive circuit 207 and is output as an emphasis output signal. A point that is before the delay unit 205 in the delay path is a point A. A point between the delay unit 205 and the limiting amplifier 206 is a point B. A point between the limiting amplifier 206 and the subtraction unit 204 is a point C.

As illustrated in FIG. 3B and FIG. 3E, at the point A, little degradation occurs in a signal waveform. As illustrated in FIG. 3C, little degradation occurs in a signal waveform delayed by the delay unit 205 when a delay amount τ of the delay unit 205 is small. Thus, as illustrated in FIG. 3D, little jitter occurs in an output signal of the limiting amplifier 206. In contrast, when the delay amount τ of the delay unit 205 is large, as illustrated in FIG. 3F, the signal waveform delayed by the delay unit 205 is degraded. Therefore, as illustrated in FIG. 3G, the jitter increases in the output signal of the limiting amplifier 206. Thus, the jitter amount tends to increase according to the delay amount T.

Figure 4A:
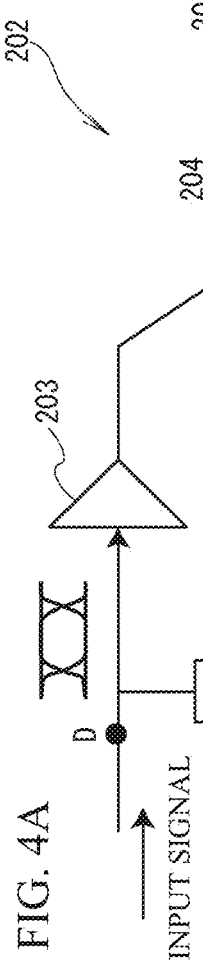
FIG. 4A illustrates an example of a structure from a drive circuit to a light emission element.

FIG. 4A illustrates an example of a structure from the drive circuit 202 to the light-emitting element 201. As illustrated in FIG. 4A, an output signal from the drive circuit 207 is input into the light-emitting element 201 as a drive signal. There is a parasitic capacitance in the light-emitting element 201 and a connection line 208.

Figure 4D:
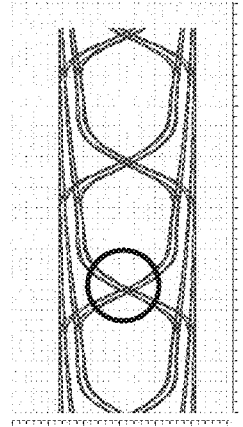
FIG. 4B to FIG. 4D illustrate a waveform.
Figure 4C:
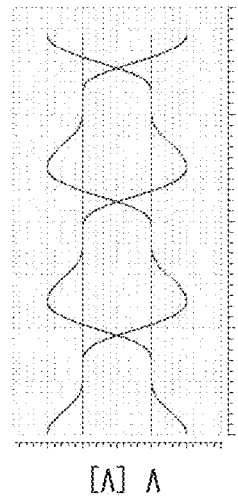
Figure 4B:
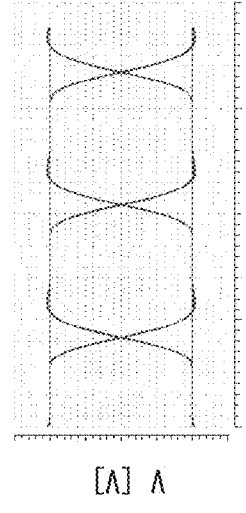

It is defined that a point before branching in the drive circuit 202 is a point D, a point between the drive circuit 207 and the connection line 208 is a point E, and a point between the connection line 208 and the light-emitting element 201 is a point F. FIG. 4B illustrates a signal waveform at the point D. FIG. 4C illustrates a waveform at the point E. Even if the signal is not degraded at the point E, a jitter tends to increase because of the parasitic capacitance of the connection line 208 and the light-emitting element 201 as illustrated in FIG. 4D.

An amplifier such as a limiting amplifier or an emphasis circuit can improve the degradation in the intensity direction. However, a jitter is accumulated. Specifically, when a signal speed gets higher, allowance in the phase direction is reduced. Therefore, improvement of the jitter is demanded. The jitter may be corrected by using a clock. However, it is necessary to use a large scale circuit such as a CDR (Clock Data Recovery) in order to generate a clock. Especially, it is difficult to reduce the jitter of optical signals, because CDRs can be applied only for electrical signals and there is no jitter reduction circuit for optical signals. And so, a description will be given of a phase compensation circuit that is capable of compensating for a phase with a simple structure in the following embodiments.

First Embodiment

Figure 5A:
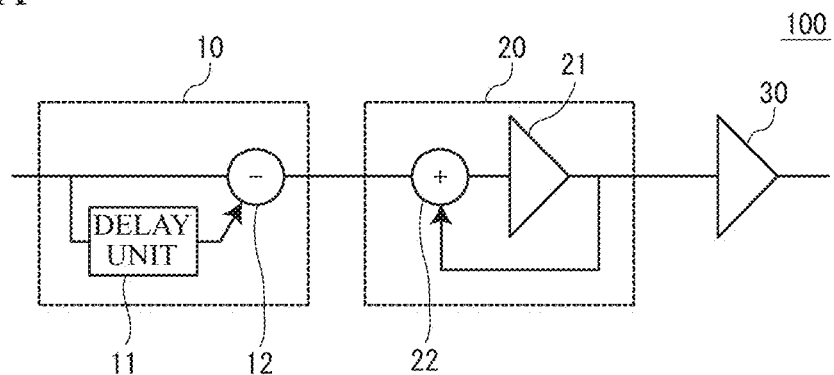
FIG. 5A illustrates a block diagram of a phase compensation circuit in accordance with a first embodiment.
Figure 5B:
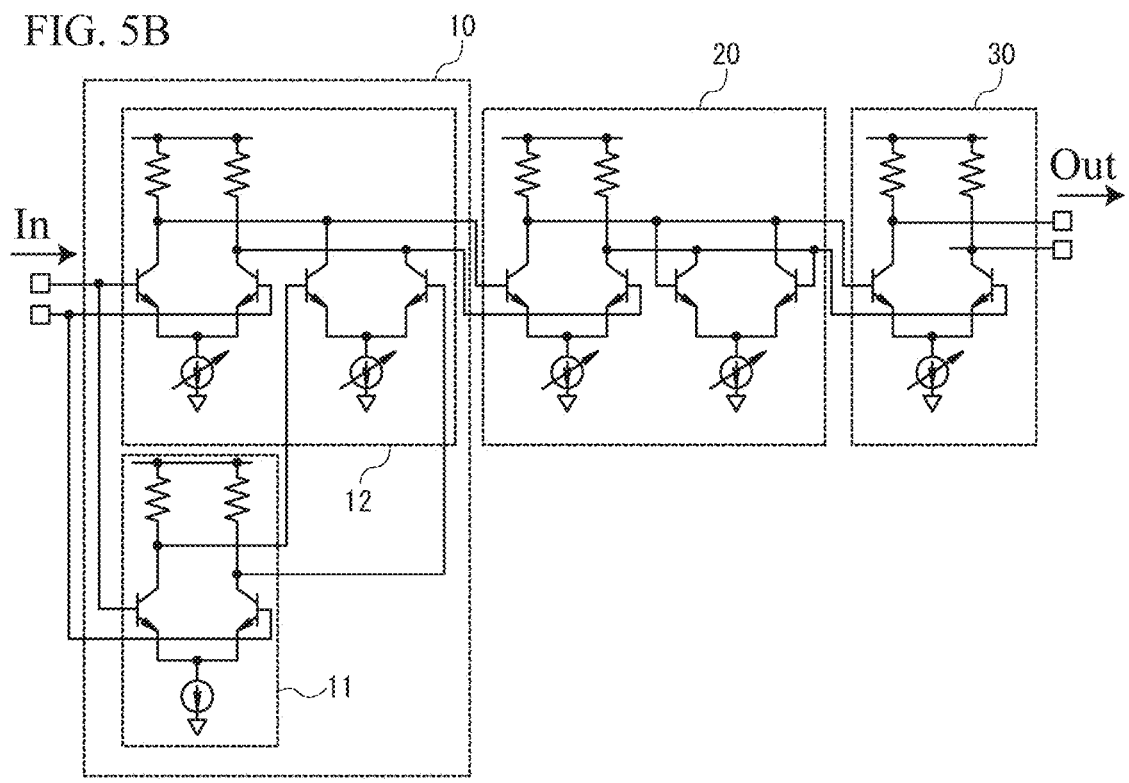
FIG. 5B and FIG. 5C illustrate a concrete circuit structure of each part of a compensation circuit.
Figure 5C:
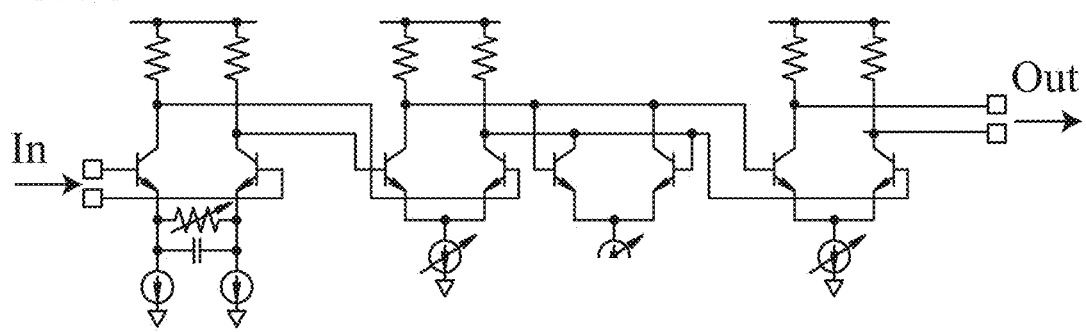

FIG. 5A illustrates a block diagram of a phase compensation circuit 100 in accordance with a first embodiment. FIG. 5B illustrates a concrete circuit structure of each part of the phase compensation circuit 100. As illustrated in FIG. 5A, the phase compensation circuit 100 has a positive phase generation circuit 10, a negative phase generation circuit 20, and a limiting amplifier 30. The phase compensation circuit 100 is provided in any of electrical circuits from a starting point to a light-emitting element in an optical transmitter. The positive phase generation circuit 10 is capable of generating a target positive phase even if the positive phase generation circuit 10 is an emphasis circuit as illustrated in FIG. 5C.

The positive phase generation circuit 10 is a circuit that increases specific phase characteristic (group delay). For example, the positive phase generation circuit 10 has a main path that does not go through a delay unit 11 after branching and a delay path that goes through the delay unit 11 after the branching. The main path and the delay path join together at a subtraction unit 12. As illustrated in FIG. 5C, the positive phase generation circuit 10 may be an equalizer type of an emphasis circuit (CTLE: Continuous Time Linear Equalizer). The equalizer type emphasis circuit has a pair of differential transistors and a tail current source connected to a source of each transistor. A variable resistor and a capacitor are coupled in parallel between each source of the pair of transistors. It is possible to adjust intensity of the emphasis by adjusting a resistance of the variable resistor. Accordingly, it is possible to increase phase characteristic (group delay).

The negative phase generation circuit 20 is a circuit that decreases specific phase characteristic (group delay). For example, the negative phase generation circuit 20 is a positive feedback differential amplifier circuit and has an amplifier 21 and an adder 22. As illustrated in FIG. 5B, the positive feedback differential amplifier circuit has two pair of differential transistors and two tail current sources. The positive feedback differential amplifier circuit has a structure in which a collector of a transistor to which a positive phase of a main signal is input is coupled with a collector of a transistor to which a positive phase of a feedback signal is input, and a collector of a transistor to which a negative phase of the main signal is input is coupled with a collector of a transistor to which a negative phase of the feedback signal is input. It is possible to adjust a feedback amount by adjusting a current ratio of the tail current sources of the two differential pairs. Accordingly, it is possible to decrease phase characteristic (group delay).

The limiting amplifier 30 is an amplifier that limits an output to a predetermined value when a single amplitude of the output is equal to or more than a predetermined value. As illustrated in FIG. 5B, for example, the limiting amplifier 30 has a pair of differential operation transistors and a tail current source.

FIG. 6A illustrates characteristic of a phase compensation frequency. In FIG. 6A, a horizontal axis indicates a frequency (GHz), and a vertical axis indicates a group delay (ps). As illustrated in FIG. 6A, when the phase compensation is not performed, the group delay is constant at any frequency. In contrast, when the positive phase compensation is performed, the group delay is shifted to a minus side. When the negative phase compensation is performed, the group delay is shifted to a plus side.

It is possible to adjust the positive phase compensation amount by adjusting intensity of the emphasis of the positive phase generation circuit 10. On the other hand, it is possible to adjust the negative phase compensation amount by adjusting the positive phase feedback amount of the negative phase generation circuit 20. A jitter occurs because of a gap of phases. Therefore, it is possible to reduce the jitter by adjusting the positive phase compensation amount of the positive phase generation circuit 10 or the negative phase compensation amount of the negative phase generation circuit 20.

FIG. 6B illustrates an input waveform that is input into the phase compensation circuit 100. As illustrated in FIG. 6B, a jitter occurs in the input waveform. As illustrated in FIG. 6C, it is possible to reduce the jitter by adjusting the positive compensation amount of the positive phase generation circuit 10 and the negative phase compensation amount of the negative phase generation circuit 20.

FIG. 7A to FIG. 7C illustrate a waveform example in a case where a phase of a high frequency region is shifted to a decreasing direction with use of the negative phase generation circuit 20. FIG. 7A illustrates an input waveform that is input to the phase compensation circuit 100. As illustrated in FIG. 7A, a jitter occurs in the input waveform. FIG. 7B and FIG. 7C illustrate an output waveform of the phase compensation circuit 100. A phase shift amount of FIG. 7C is more than a phase shift amount of FIG. 7B. As illustrated in FIG. 7B and FIG. 7C, a jitter increases as the phase shift amount increases. Therefore, the jitter of the input signal is generated on the side of negative phase.

FIG. 7D to FIG. 7F illustrate a waveform example in a case where the phase of the high frequency region is shifted to an increasing direction with use of the positive phase generation circuit 10. FIG. 7D is the same as FIG. 7A. FIG. 7E and FIG. 7F illustrate an output waveform of the phase compensation circuit 100. The phase shift amount of FIG. 7F is more than the phase shift amount of FIG. 7E. As illustrated in FIG. 7E and FIG. 7F, the jitter increases again after decreasing. Therefore, there is an optimal point that improves the jitter by adjusting the phase shift amount. For example, FIG. 7E illustrates the optimal point. In this way, it is possible to reduce the jitter by adjusting the positive phase compensation amount of the positive phase generation circuit 10 or the negative phase compensation amount of the negative phase generation circuit 20. And it is possible to search an optimal point for reducing a jitter.

FIG. 8 illustrates an example of a flowchart of a phase compensation method with use of the phase compensation circuit 100. As illustrated in FIG. 8, phase characteristic (group delay) is gradually increased by the positive phase generation circuit 10 (Step S1). Next, it is determined whether there is a point achieving a desirable phase (Step S2). When it is determined as "Yes" in the Step S2, the phase characteristic of the positive phase generation circuit 10 is set to a point achieving the desirable phase (Step S3). When it is determined as "No" in the Step S2, the phase characteristic (group delay) is gradually decreased by the negative phase generation circuit 20 (Step S4). Next, the group delay is set to a point achieving the desirable phase (Step S5). Although the phase characteristic of the positive phase generation circuit 10 is adjusted on ahead in the flowchart of FIG. 8, the phase characteristic of the negative phase generation circuit 20 may be adjusted on ahead.

Figure 9A:
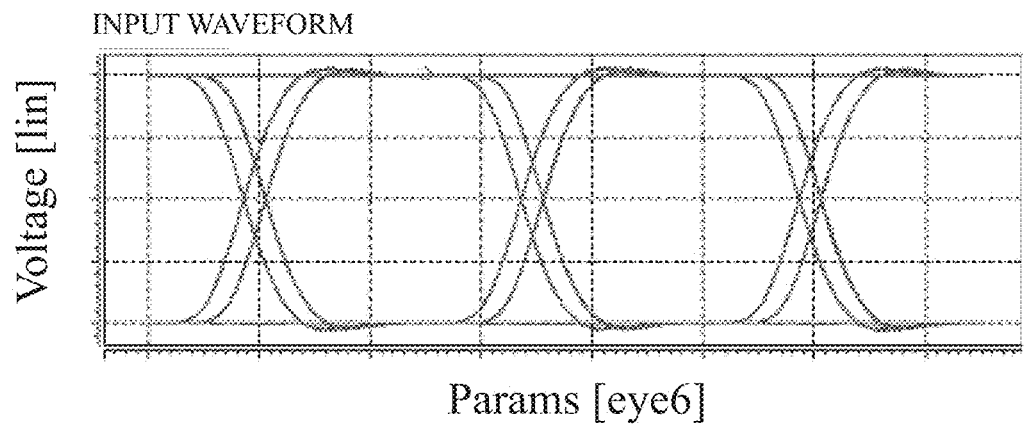
FIG. 9A to FIG. 9C illustrate a waveform.
Figure 9B:
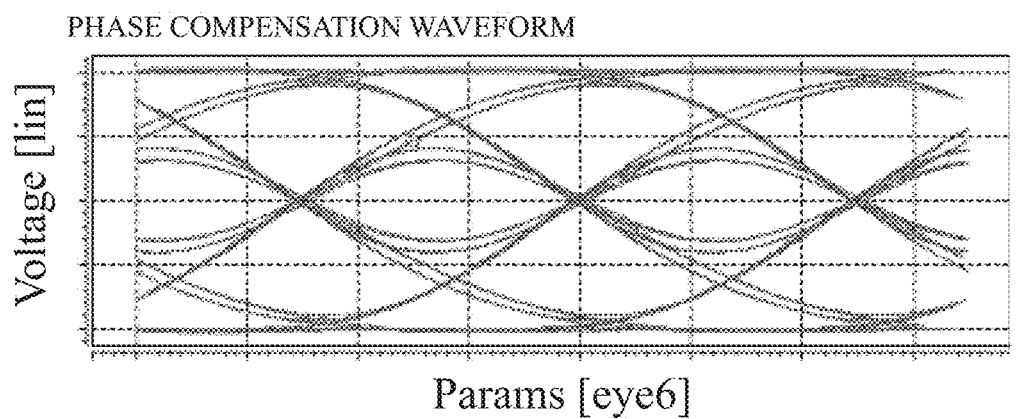
Figure 9C:
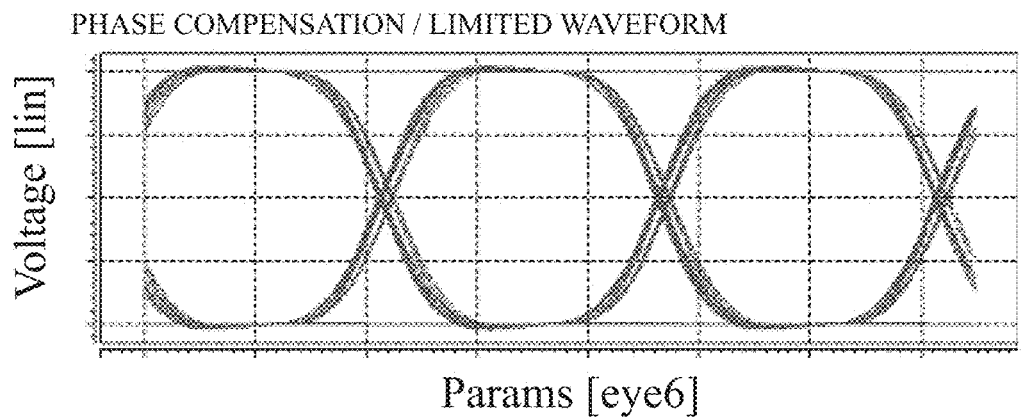

FIG. 9A to FIG. 9C illustrate a process of the phase compensation with use of the phase compensation circuit 100. FIG. 9A illustrates a waveform of an input signal in which a jitter occurs. FIG. 9B illustrates a waveform after adjusting of the positive phase compensation amount of the positive phase generation circuit 10 or the negative phase compensation amount of the negative phase generation circuit 20. In FIG. 9B, the jitter is suppressed by adjusting the phase shift amount. However, amplitude intensity is accordingly degraded. It is possible to improve the amplitude intensity by amplifying the signal of which amplitude intensity is degraded with use of the limiting amplifier 30, as illustrated in FIG. 9C.

As mentioned above, it is possible to reduce a jitter by adjusting the positive phase compensation amount of the positive phase generation circuit 10 or the negative phase compensation amount of the negative phase generation circuit 20. Further, it is possible to improve the amplitude intensity in addition to the suppression of the jitter by amplifying the signal of which jitter is reduced with use of the limiting amplifier. Although the emphasis generation circuit of FIG. 5B is used as the positive phase generation circuit 10 in the embodiment, the equalizer type emphasis circuit of FIG. 5C may be used.

Second Embodiment

Figure 10:
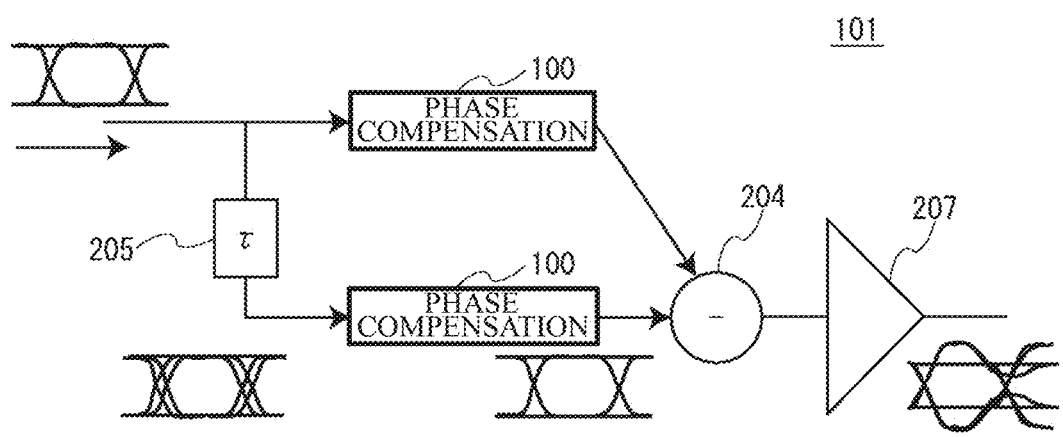
FIG. 10 illustrates a block diagram of an emphasis signal generation circuit in accordance with a second embodiment.

FIG. 10 illustrates a block diagram of an emphasis signal generation circuit 101 in accordance with a second embodiment. An explanation of the same structure as FIG. 3 is omitted by adding the same numerous. A delay unit 205 is a delay circuit for a pre-emphasis generation used for a speed compensation or the like. The delay unit 205 acts as a part of a drive circuit. The emphasis signal generation circuit 101 has the phase compensation circuit 100 on both the main path and the delay path. In the example, the phase compensation circuit 100 is located after the delay unit 205 in the delay path.

When the phase compensation circuit 100 is provided on the delay path as in the case of the emphasis signal generation circuit 101, an occurrence of a jitter in the delay unit 205 can be suppressed. When the phase compensation circuit 100 is located before the delay unit 205, a jitter of an output of the delay unit can be compensated for as well as the delay unit 205. When the phase compensation circuit 100 is provided on both the delay path and the main path, the phase adjusting and the phase compensation can be independently achieved. And, an influence on a delay difference can be reduced.

FIG. 11A illustrates a usage example of the emphasis signal generation circuit 101. A description will be given of a phase compensation in a case where an output signal of the emphasis signal generation circuit 101 is input to the light-emitting element 201. A point before a branching point of the emphasis signal generation circuit 101 is a point (1). A point after the phase compensation circuit 100 in the main path is a point (2). A point after the phase compensation circuit 100 in the delay path is a point (3). A point after the drive circuit 207 is a point (4). A point after the light-emitting element 201 and the connection line 208 is a point (5).

Even if a jitter in an output signal of the emphasis signal generation circuit 101 is suppressed, a new jitter may occur because of a parasitic capacitance of the light-emitting element 201 and the connection line 208. In this case, a jitter may be intentionally added to a signal in a reverse direction that is input to the connection line 208. For example, a jitter is not added at the point (2), and a jitter is intentionally added at the point (3). In this case, an emphasis signal in which a predetermined jitter is added is generated at the point (4). And, a jitter of a drive signal at the point (5) can be minimized. Further, a jitter may be intentionally added so that a jitter of the output of the light-emitting element 201 is minimized or a jitter is minimized at an optical receiver that receives a light.

FIG. 11B illustrates a signal waveform at the point (1). FIG. 11C illustrates a signal waveform at the point (2). FIG. 11D illustrates a signal waveform at the point (3). FIG. 11E illustrates a signal waveform at the point (4). FIG. 11F illustrates a signal waveform at the point (5). As illustrated in FIG. 11B to FIG. 11F, when a jitter is not added at the point (2) and a jitter is intentionally added at the point (3) by the phase compensation circuit, a jitter can be added to an emphasis signal. Thus, a desirable jitter compensation and a desirable jitter generation can be achieved with respect to the individual paths. Therefore, a freedom degree of a phase setting of an emphasis signal can be improved, and a drive signal of which intensity characteristic and phase characteristic of an emphasis signal is optionally set can be output. And, it is possible to generate a drive signal so that a jitter of the output of the light-emitting element 201 is minimized.

Third Embodiment

A description will be given of positive and negative phase characteristic by the positive phase generation circuit 10 of FIG. 5A. FIG. 12A illustrates a part of a phase generation circuit. As illustrated in FIG. 12A, a point before the subtraction unit 12 in a main path that does not go through the delay unit 11 is a point "a", and a point between the delay unit 11 and the subtraction unit 12 in the delay path is a point "β". A subtraction ratio of the subtraction unit 12 is expressed as "a". A delay amount at the delay unit 11 is expressed as "T".

In a post-cursor type in which an output of a main path is subtracted from an output of a delay path, a transfer function H(ω), a phase θ(ω) and a group delay Gd(ω) are expressed by the following formulas (1) to (3). On the other hand, in a pre-cursor type in which an output of a delay path is subtracted from an output of a main path, a transfer function H(ω), a phase θ(ω) and a group delay Gd(ω) are expressed by the following formulas (4) to (6).

[Formula 1]
$$H(\omega) = 1 - a\ \exp(-j\omega T) \quad (1)$$

[Formula 2]
$$\Theta(\omega) = arg(1 - a\ \exp(-j\omega T)) = -\tan^{-1}\left(\frac{a\ \sin(\omega T)}{1 - a\ \cos(\omega T)}\right) \quad (2)$$

[Formula 3]
$$Gd(\omega) = \frac{-aT(\cos(\omega T) - a)}{(a - s\ \cos(\omega T))^2 + (a\ \sin(\omega T))^2} \quad (3)$$

[Formula 4]
$$H(\omega) = -a + \exp(-j\omega T) \quad (4)$$

[Formula 5]
$$\Theta(\omega) = arg(-a + \exp(-j\omega T)) = -\tan^{-1}\left(\frac{-\sin(\omega T)}{-a + \cos(\omega T)}\right) \quad (5)$$

[Formula 6]
$$Gd(\omega) = \frac{-T(a\ \cos(\omega T) - 1)}{(-a + \cos(\omega T))^2 + (\sin(\omega T))^2} \quad (6)$$

In this way, it is possible to switch increasing of specific phase characteristic (group delay) and decreasing of the specific phase characteristic (group delay) by reversing the subtraction direction of the subtraction unit 12. As illustrated in FIG. 12D, when the subtraction is not performed, the phase characteristic does not change. In contrast, when the pre-cursor emphasis or the post-cursor emphasis is performed, the phase characteristic can be increased or decreased as illustrated in FIG. 12E and FIG. 12F. FIG. 12C illustrates the phase characteristic (group delay). However, as illustrated in FIG. 12B, when the phase is generated, the intensity characteristic is also emphasized. Therefore, it is not possible to adjust only the phase characteristic. And so, a limiting amplifier is used.

Figure 13:
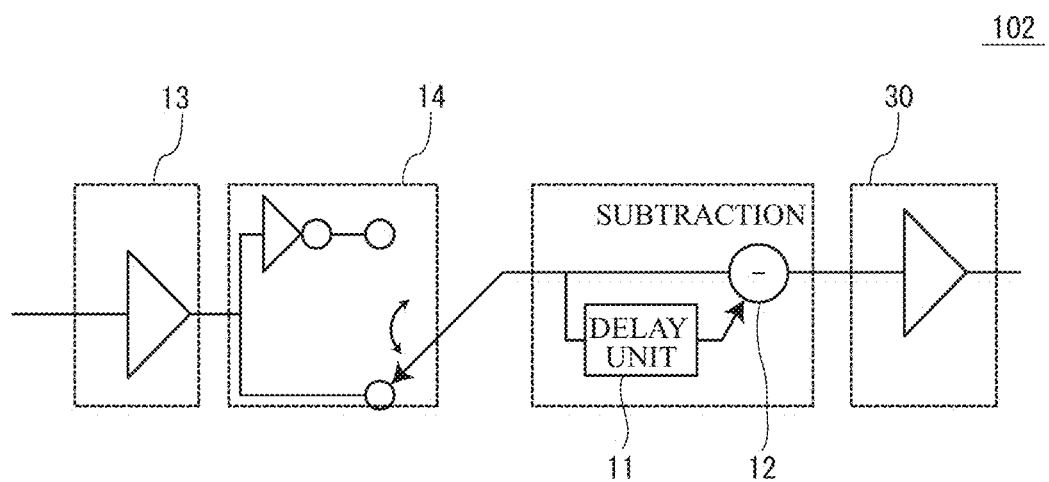
FIG. 13 illustrates a block diagram of a phase compensation circuit in accordance with a third embodiment.

FIG. 13 illustrates a block diagram of a phase compensation circuit 102 in accordance with a third embodiment. As illustrated in FIG. 13, the phase compensation circuit 102 is different from the phase compensation circuit 100 in a point that a limiting amplifier 13 and a logic selection circuit 14 are provided, and the negative phase generation circuit 20 is not provided. The logic selection circuit 14 is a circuit for switching a positive phase and a negative phase of a signal logic. When the positive phase and the negative phase of the signal logic is switched, the subtraction object of the subtraction unit 12 is reversed.

In the embodiment, it is possible to select the increasing and the decreasing of the phase by reversing the logic. When the subtraction ratio is adjusted, a phase compensation amount can be adjusted. The limiting amplifier 30 can adjust the amplitude. It is therefore possible to compensate for a phase with a simple structure. In the embodiment, the delay unit 11 and the subtraction unit 12 act as a phase adjust circuit that increases or decreases phase characteristic of a specific frequency by outputting a difference between an input electrical signal and a delay signal that is generated by delaying the input electrical signal. The logic selection circuit 14 acts as a control circuit that switches increasing and decreasing of the phase characteristic of the phase adjust circuit.

FIG. 14 illustrates a flowchart of a phase compensation method with use of the phase compensation circuit 102. As illustrated in FIG. 14, the phase characteristic (group delay) is gradually increased by increasing the delay amount of the delay unit 11 gradually without logic reversing of the logic selection circuit 14 (Step S11). Next, it is determined whether there is a point achieving a desirable phase (Step S12). When it is determined as "Yes" in the Step S12, the phase characteristic of the positive phase generation circuit 10 is set to the point achieving the desirable phase (Step S13). When it is determined as "No" in the Step S12, the phase characteristic (group delay) is decreased by reversing the logic of the logic selection circuit 14 and increasing the delay amount of the delay unit 11 gradually (Step S14). Next, the phase characteristic is set to the point achieving the desirable phase (Step S15).

In the above-mentioned embodiments, an electrical signal of an optical transmitter is used. However, the structure it not limited. The above-mentioned phase compensation circuit may be used for a phase compensation with respect to an electrical signal obtained by a photoelectric conversion of an optical receiver.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An emphasis signal generation circuit comprising:
    a plurality of individual paths, at least one of which is a delay path; and
    a phase compensation circuit provided in at least one of the individual paths, the phase compensation circuit comprising a first circuit, a second circuit and a limiting amplifier,
    a delay amount of the first circuit being larger on a higher frequency side than on a lower frequency side so that the first circuit increases phase characteristic of a specific frequency of an electrical signal,
    the second circuit being coupled with the first circuit in series
    a delay amount of the second circuit beinq smaller on a higher frequency side than on a lower frequency side so that the second circuit decreases the phase characteristic of the specific frequency of the electrical signal,
    the limiting amplifier being provided after the first circuit and the second circuit and being configured to amplify an electrical signal that is processed by at least one of the first circuit and the second circuit.

2. The emphasis signal generation circuit as claimed in claim 1, wherein the phase compensation circuit is provided after or before a delay circuit in the delay path.

3. The emphasis signal generation circuit as claimed in claim 1, wherein the first circuit is an emphasis signal generation circuit that increases phase characteristic of a predetermined band.

4. The emphasis signal generation circuit as claimed in claim 3, wherein the first circuit is an equalizer circuit.

5. The emphasis signal generation circuit as claimed in claim 1, wherein the second circuit is a positive feedback differential amplifier circuit.

6. An emphasis signal generation method by using a phase compensation circuit comprising:
    achieving a desirable phase by adjusting phase characteristic of at least one of a first circuit and a second circuit,
    wherein the phase compensation circuit comprises:
    a plurality of individual paths, at least one of which is a delay path; and
    a phase compensation circuit provided in at least one of the individual paths, the phase compensation circuit comprising a first circuit, a second circuit and a limiting amplifier,
    a delay amount of the first circuit being larger on a higher frequency side than on a lower frequency side so that the first circuit increases phase characteristic of a specific frequency of an electrical signal,
    the second circuit being coupled with the first circuit in series
    a delay amount of the second circuit being smaller on a higher frequency side than on a lower frequency side so that the second circuit decreases the phase characteristic of the specific frequency of the electrical signal,
    the limiting amplifier being provided after the first circuit and the second circuit and being configured to amplify an electrical signal that is processed by at least one of the first circuit and the second circuit.

* * * * *